United States Patent
Oda

(10) Patent No.: US 10,256,564 B2
(45) Date of Patent: Apr. 9, 2019

(54) ELECTRIC COMPONENT SOCKET AND MANUFACTURING METHOD FOR THE SAME

(71) Applicant: ENPLAS CORPORATION, Kawaguchi-shi, Saitama (JP)

(72) Inventor: Takahiro Oda, Kawaguchi (JP)

(73) Assignee: ENPLAS CORPORATION, Kawaguchi-Shi (JP)

( * ) Notice: Subject to any disclaimer, the term of this patent is extended or adjusted under 35 U.S.C. 154(b) by 0 days.

(21) Appl. No.: 15/562,559

(22) PCT Filed: Mar. 22, 2016

(86) PCT No.: PCT/JP2016/058977
§ 371 (c)(1),
(2) Date: Sep. 28, 2017

(87) PCT Pub. No.: WO2016/158567
PCT Pub. Date: Oct. 6, 2016

(65) Prior Publication Data
US 2018/0115101 A1    Apr. 26, 2018

(30) Foreign Application Priority Data

Mar. 31, 2015  (JP) ................................ 2015-071627
Mar. 31, 2015  (JP) ................................ 2015-071629

(51) Int. Cl.
*H01R 13/24* (2006.01)
*G01R 1/073* (2006.01)
(Continued)

(52) U.S. Cl.
CPC ......... *H01R 13/2435* (2013.01); *G01R 1/073* (2013.01); *G01R 31/26* (2013.01);
(Continued)

(58) Field of Classification Search
CPC .. H01R 13/2435; H01R 9/096; H01R 12/716; H01R 13/03
(Continued)

(56) References Cited

U.S. PATENT DOCUMENTS 4,423,376 A * 12/1983 Byrnes ................... G01R 1/073
                                                              324/750.25
4,963,822 A * 10/1990 Prokopp ............ G01R 1/07328
                                                              324/72.5
(Continued)

FOREIGN PATENT DOCUMENTS

JP          3206922       7/2001
JP       2003-187937      7/2003
(Continued)

OTHER PUBLICATIONS

International Written Opinion, PCT/ISA/237, dated Jun. 21, 2016, in corresponding International Patent Application No. PCT/JP2016/058977.

(Continued)

*Primary Examiner* — Tulsidas C Patel
*Assistant Examiner* — Marcus E Harcum
(74) *Attorney, Agent, or Firm* — Staas & Halsey LLP

(57) ABSTRACT

An electric component socket in which a first electric component is housed in a first plate, a second plate is disposed to face the second electric component, a third plate is disposed at a middle position between the first and the second plates, and a plurality of electric contacts are used to electrically connect the first and second electric components, the electric contact includes: a spring part that is inserted into an insertion hole in the third plate; first and second contact parts extending from both terminals of the spring (Continued)

part, and inserted into insertion holes in the first and second plates to be in contact with electrodes of the first and second electric components.

5 Claims, 7 Drawing Sheets

(51) Int. Cl.
  *G01R 31/26*   (2014.01)
  *H01R 12/70*   (2011.01)
  *H01R 33/74*   (2006.01)
  *H01R 43/20*   (2006.01)
  *H01R 33/76*   (2006.01)
  *H01R 13/03*   (2006.01)

(52) U.S. Cl.
  CPC ..... *H01R 12/7076* (2013.01); *H01R 13/2485* (2013.01); *H01R 33/74* (2013.01); *H01R 43/20* (2013.01); *H01R 13/03* (2013.01); *H01R 13/24* (2013.01); *H01R 33/76* (2013.01)

(58) Field of Classification Search
  USPC ..................................... 439/66, 74, 591, 482
  See application file for complete search history.

(56) References Cited

U.S. PATENT DOCUMENTS

| | | | | | |
|---|---|---|---|---|---|
| 5,419,710 | A * | 5/1995 | Pfaff | ............... | G01R 1/0483 439/266 |
| 5,685,725 | A * | 11/1997 | Uratsuji | ............... | G01R 1/0466 439/482 |
| 6,417,684 | B1 * | 7/2002 | Schmid | ............... | G01R 1/07357 324/750.25 |
| 6,488,513 | B1 * | 12/2002 | Neidich | ............... | H01R 13/2435 439/66 |
| 6,676,418 | B2 * | 1/2004 | Watanabe | ............... | H01R 12/88 439/342 |
| 6,749,443 | B2 * | 6/2004 | Sano | ............... | H01R 13/2485 439/331 |
| 6,811,407 | B2 * | 11/2004 | Watanabe | ............... | H01R 13/2435 439/331 |
| 6,869,289 | B2 * | 3/2005 | Sabatier | ............... | G01R 1/07357 439/482 |
| 7,254,889 | B1 * | 8/2007 | Cherian | ............... | G01R 1/0466 257/E23.048 |
| 7,322,830 | B2 * | 1/2008 | Szu | ............... | H01R 13/2442 439/330 |
| 7,341,485 | B2 * | 3/2008 | Polnyi | ............... | H01R 13/2435 439/591 |
| 7,462,056 | B2 * | 12/2008 | Yeh | ............... | H01R 12/58 439/331 |
| 7,815,442 | B2 * | 10/2010 | Hsu | ............... | G01R 1/06722 439/66 |
| 8,342,872 | B2 * | 1/2013 | Suzuki | ............... | G01R 1/0466 439/331 |
| 2003/0114034 | A1 | 6/2003 | Sano et al. | | |
| 2004/0029412 | A1 * | 2/2004 | Hachuda | ............... | G01R 1/06722 439/66 |
| 2004/0229500 | A1 | 11/2004 | Ichihara et al. | | |
| 2004/0239355 | A1 * | 12/2004 | Kazama | ............... | C23C 28/023 324/755.05 |
| 2012/0058683 | A1 | 3/2012 | Suzuki et al. | | |

FOREIGN PATENT DOCUMENTS

| | | |
|---|---|---|
| JP | 2004-342466 | 12/2004 |
| JP | 2012-54207 | 3/2012 |
| WO | WO 98/11449 | 3/1998 |

OTHER PUBLICATIONS

International Search Report, PCT/ISA/210, dated Jun. 21, 2016, in corresponding International Patent Application No. PCT/JP2016/058977.

* cited by examiner

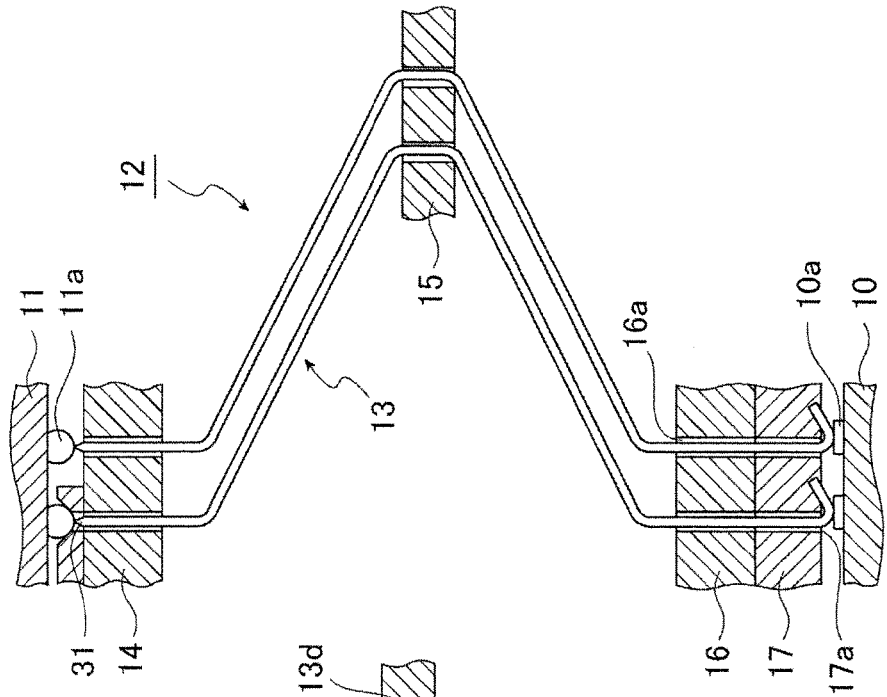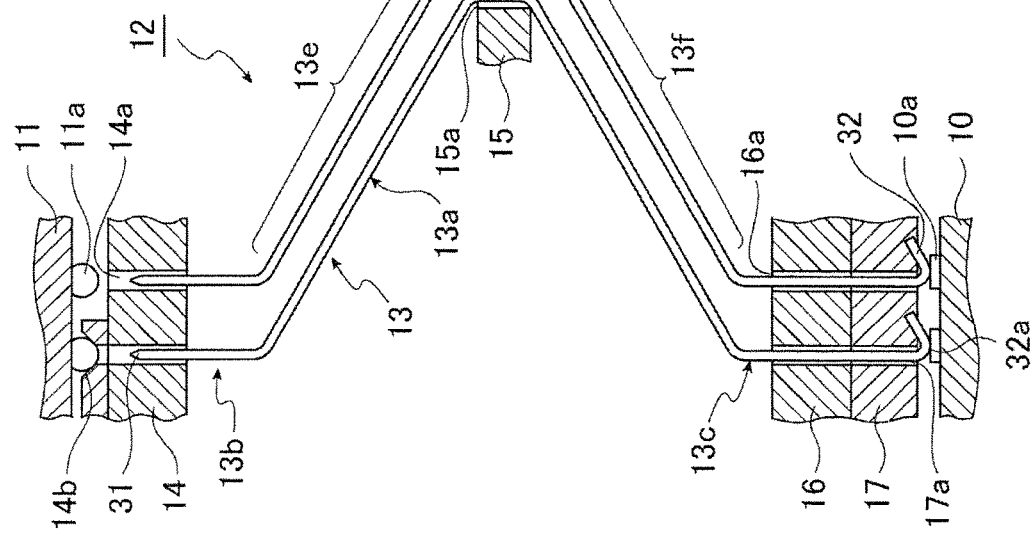

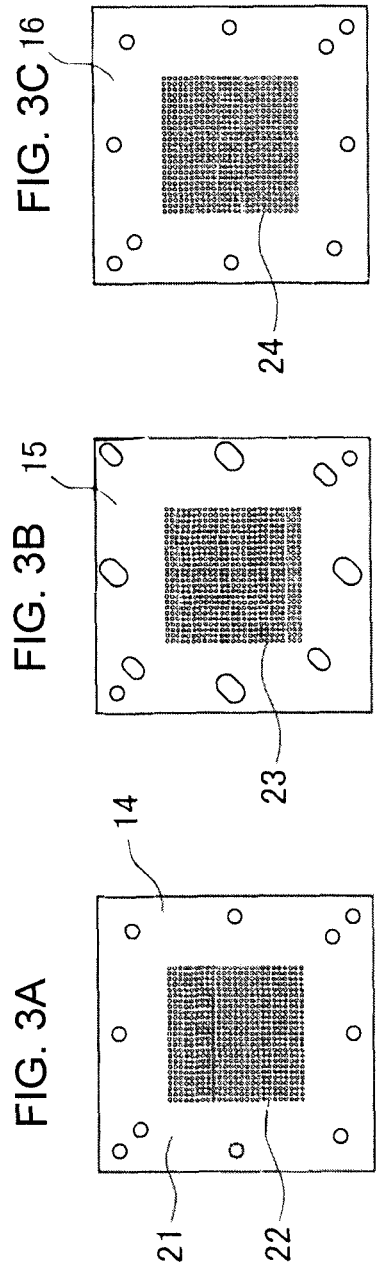

ELECTRIC COMPONENT SOCKET AND MANUFACTURING METHOD FOR THE SAME

CROSS-REFERENCE TO RELATED APPLICATIONS

This application is a U.S. National Stage Application, which claims the benefit under 35 U.S.C. § 371 of International Patent Application No. PCT/JP2016/058977, filed Mar. 22, 2016, which claims the foreign priority benefit under 35 U.S.C. § 119 of Japanese Patent Application No. 2015-071627, filed Mar. 31, 2015, and Japanese Patent Application No. 2015-071629, filed Mar. 31, 2015, the contents of which are incorporated herein by reference.

TECHNICAL FIELD

The present invention relates to an electric component socket that electrically connects a first electric component such as a semiconductor device (e.g., an "IC package") and a second electric component such as a wiring board using an electric contact, and a method of manufacturing such an electric component socket.

BACKGROUND ART

There has been conventionally known such electric component sockets (e.g., "IC sockets") as disclosed, for example, in Japanese Patent No. 3206922 described below as this type of electric component socket.

In Japanese Patent No. 3206922, an IC socket is disposed on a wiring board, and houses an IC package therein. A wire probe provided in the IC socket is used to electrically connect an electrode of the wiring board and an electrode of the IC package.

The wire probe has ball-shaped contact points formed at both ends thereof, and is embedded in an elastomer material layer in a state being deformed into a predetermined shape.

CITATION LIST

Summary of Invention

Technical Problem

A conventional IC socket described above is required which is capable of sufficiently ensuring stability and reliability of an electrical connection between a contact part of a wire probe and a terminal of an IC package.

However, when such a conventional IC socket is repeatedly used for a long period of time, a material for forming the terminal of the IC package may be attached to the contact part of the wire probe. Then, an electric resistance of the contact part may be increased which cannot ensure the stability and the reliability of the electrical connection. When the terminal of the IC package is made of lead-free solder alloy (tin), and a number of IC packages are repeatedly subjected to a burn-in test at a high temperature, the tin is melted to attach to the contact parts of the wire probes and then be alloyed. As a result, the contact resistance between the wire probe and the terminal of the IC package is increased, thereby impairing the reliability of an operation test or the like.

In order to hardly attach the material for forming the terminal of the IC package to the contact part of the wire probe, it is desirable to make the contact pressure of the wire probe against the terminal of the IC package small as much as possible.

In a manufacturing process for the IC socket disclosed in Japanese Patent No. 3206922, a ball-shaped contact point is formed at each of lower ends of the wire probes 13, the lower ends of the wire probes are individually adhered to a surface of the board, each of the wire probes is deformed into a predetermined shape, upper ends thereof are cut, and a ball-shaped contact point is formed at each of the upper ends.

Accordingly, the IC socket disclosed in Japanese Patent No. 3206922 has disadvantages of a complicated manufacturing process and a high manufacturing cost.

An object of the present invention is to provide an electric component socket capable of extremely reducing a contact pressure of an electric contact against an electrode of an electric component, and to provide a method of manufacturing such an electric component socket in a simple process and at a low cost.

Solution to Problem

An electric component socket according to a first aspect of the present invention includes: a first plate that has a first insertion hole, and houses a first electric component; a second plate that has a second insertion hole, and is disposed to face a second electric component; a third insulating plate that has a third insertion hole, and is disposed at a middle position between the first plate and the second plate, and a plurality of electric contacts that electrically connect the first electric component and the second electric component, each of the electric contacts including: a spring part that is inserted into the third insertion hole in the third plate, and includes a substantially linear first spring region that obliquely extends toward the first plate, and a substantially linear second spring region that obliquely extends toward the second plate; a first contact part that extends from the first spring region of the spring part, and is inserted into the first insertion hole provided in the first plate to be in contact with a first electrode of the first electric component; and a second contact part that extends from the second spring region of the spring part, and is inserted into the second insertion hole provided in the second plate to be in contact with a second electrode of the second electric component.

In the electric component socket according to the first aspect of the present invention, it is desirable for the spring part to be formed so that a center portion of a springy wire material is plastically deformed into a substantially "V" shape or a substantially "U" shape.

In the electric component socket according to the first aspect of the present invention, it is desirable for the first plate to be vertically movably provided, and for the second plate to be fixed.

In the electric component socket according to the first aspect of the present invention, it is desirable for the third plate to be engaged with a boundary portion between the first spring region and the second spring region of each of the plurality of electric contacts to thereby be supported by the electric contacts.

A method of manufacturing an electric component socket according to a second aspect of the present invention is a method of manufacturing the electric component socket including an electric contact that includes: a first contact part that is inserted into a first insertion hole in a first plate to be in contact with a first electrode of a first electric component; a second contact part that is inserted into a second insertion hole in a second plate to be in contact with a second electrode of a second electric component; and a spring part that brings at least the first contact part into contact with the first electrode of the first electric component by a predetermined contact pressure, the method including: a first step of inserting a substantially linear springy wire material into the first insertion hole in the first plate and the second insertion hole in the second plate in a state where the first plate and the second plate are set close to each other; a second step of separating the first plate and the second plate from one another so that the first contact part of the springy wire material is inserted into the first insertion hole and the second contact part is inserted into the second insertion hole; a third step of moving the first plate with respect to wire support means in a state where a substantially center portion of the springy wire material is supported by the wire support means so that a region of the springy wire material between the first plate and the wire support means is plastically deformed; and a fourth step of moving the second plate with respect to the wire support means in a state where the substantially center portion of the springy wire material is supported by the wire support means so that a region of the springy wire between the second plate and the wire support means is plastically deformed.

In the method of manufacturing an electric component socket according to the second aspect of the present invention, it is desirable for the third and fourth steps each to be a step of moving the first plate and the second plate in a circular arc shape in a stationary state of the wire support means.

In the method of manufacturing an electric component socket according to the second aspect of the present invention, it is desirable for the electric component socket to be further provided with a third insulating plate that is disposed between the first plate and the second plate to prevent a contact between the electric contacts, for the third plate to have a third insertion hole for inserting the springy wire material therethrough, and for the second step and the third step to use the third plate as the wire support means.

In the method of manufacturing an electric component socket according to the second aspect of the present invention, it is desirable to perform the third step and the fourth step simultaneously.

An electric component socket according to a third aspect of the present invention is manufactured by the method of manufacturing an electric component socket according to the second aspect.

Advantageous Effects of Invention

According to the electric component socket according to the first aspect of the present invention, a biasing force of the spring part is generated by the substantially linear first spring region that obliquely extends toward the first plate and the substantially linear second spring region that obliquely extends toward the second plate, thereby capable of extremely reducing the contact pressure of the electric contact against the first electrode of the first electric component. Thus, the material for forming the first electrode of the first electric component is hardly attached to the first contact part of the electric contact. Accordingly, the electric component socket can be provided which is capable of sufficiently lowering the contact resistance when the electric contact is brought into contact with the first electric component and hardly increasing the contact resistance even if the electric contact is used for a long period of time.

In the electric component socket according to the first aspect of the present invention, the spring part is formed so that the center portion of the springy wire material is plastically deformed into a substantially "V" shape or a substantially "U" shape, thereby capable of manufacturing the electric component socket in a simple process and at a low cost.

In the electric component socket according to the first aspect of the present invention, the first plate is vertically movably provided, and the second plate is fixed, thereby capable of sufficiently increasing the contact pressure of the second plate against the second electrode of the second electric component even if the contact pressure of the first plate against the first electrode of the first electric component is extremely reduced.

In the electric component socket according to the first aspect of the present invention, the third plate is engaged with a boundary portion between the first spring region and the second spring region of the electric contact, thereby capable of smoothly deforming the electric contact when the first electric component is housed in the first plate.

According to the method of manufacturing an electric component socket according to the second aspect of the present invention, a probe wire can be plastically deformed only by a very simple process to manufacture the electric contact, thereby capable of manufacturing the electric component socket in a simple process and at a low cost.

In the method of manufacturing an electric component socket according to the second aspect of the present invention, the first plate and the second plate are moved in a circular arc shape in a stationary state of the wire support means, thereby further simplifying the manufacturing process.

In the method of manufacturing an electric component socket according to the second aspect of the present invention, the wire support means used to plastically deform the electric contact is used as it is as the third plate to prevent a contact between the electric contacts, thereby further simplifying the manufacturing process.

In the method of manufacturing an electric component socket according to the second aspect of the present invention, the third step and the fourth step are performed simultaneously, thereby capable of further reducing the number of manufacturing processes.

According to the method of manufacturing an electric component socket according to the third aspect of the present invention, the method of manufacturing an electric component socket according to the second aspect is used, thereby capable of manufacturing the electric component socket at a low cost.

BRIEF DESCRIPTION OF DRAWINGS

FIG. 1A is a plan view, and FIG. 1B is a cross-sectional view taken along line A-A.

FIGS. 2A and 2B are cross-sectional views each schematically illustrating a main portion configuration of the IC socket according to Embodiment 1 of the present invention, where FIG. 2A illustrates a state where an IC package is not housed in the IC socket, and FIG. 2B illustrates a state where the IC package is housed in the IC socket.

FIGS. 3A, 3B, and 3C are cross-sectional views each schematically illustrating a main portion configuration of the IC socket according to Embodiment 1 of the present invention, where FIG. 3A illustrates an upper side plate, FIG. 3B illustrates an intermediate plate, and FIG. 3C illustrates a lower side plate.

FIG. 4A illustrates a first contact part, and FIG. 4B illustrates a second contact part.

FIG. 7A is a plan view, and FIG. 7B is a cross-sectional view.

DESCRIPTION OF EMBODIMENTS

Figure 1A:
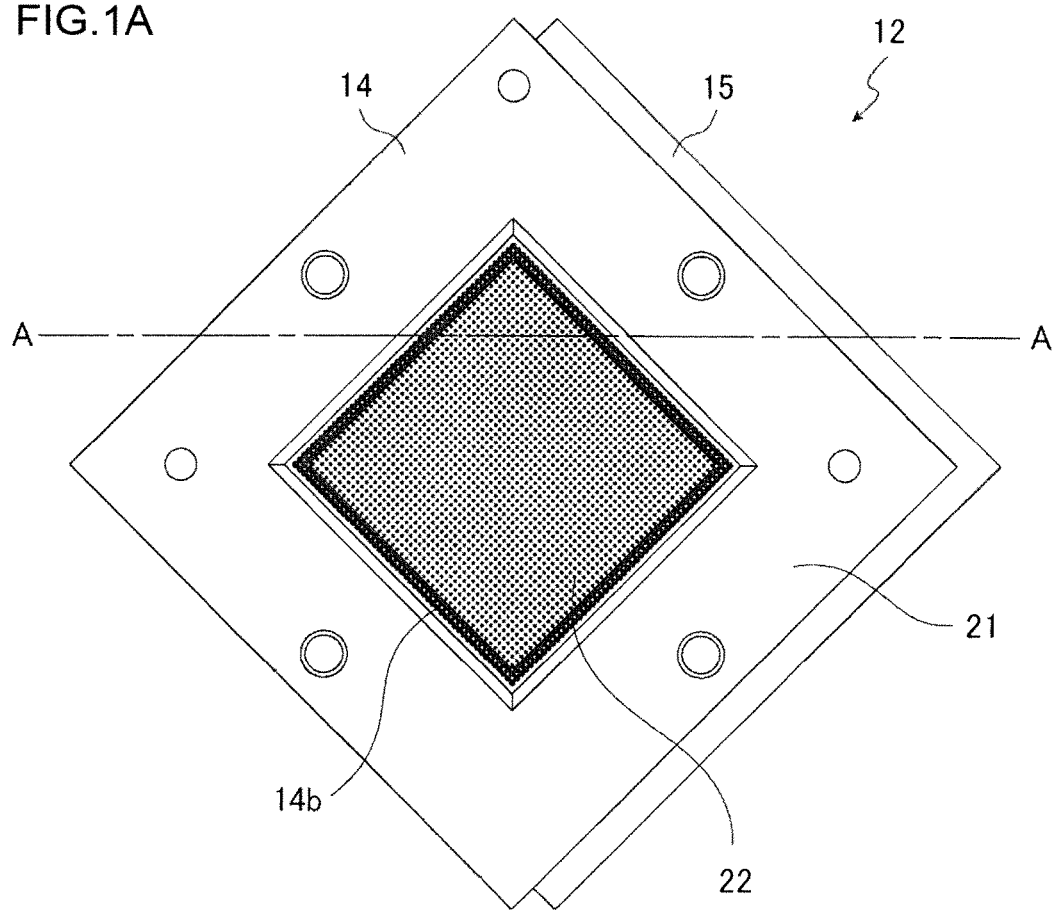
FIGS. 1A and 1B are cross-sectional views each schematically illustrating a configuration of an IC socket according to Embodiment 1 of the present invention, where

Embodiments of the present invention are described below.

Embodiment 1 of Invention

In the present embodiment, an IC socket 12 as an "electric component socket" is disposed on a wiring board 10 as a "second electric component," and houses an IC package 11 as a "first electric component," as illustrated in FIGS. 1A, 1B, 2A, and 2B. A solder ball 11a as a "first electrode" of the IC package 11 is electrically connected with an electrode 10a as a "second electrode" of the wiring board 10 through the IC socket 12.

The IC socket 12 includes: a plurality of wire probes 13 as "electric contacts"; an upper side plate 14 as a "first plate"; an intermediate plate 15 as a "third plate"; a lower side plate 16 as a "second plate"; and an elastomer sheet 17.

The wire probe 13 is an electric contact that electrically connects the solder ball 11a of the IC package 11 and the electrode 10a of the wiring board 10, and is formed by plastically deforming one wire material (to be described later). The wire probes 13 are disposed in the IC socket 12 along a vertical direction, in, e.g., a matrix form.

FIGS. 2A and 2B each illustrate only two of the plurality of wire probes 13. As illustrated FIGS. 2A and 2B, the wire probe 13 includes: a spring part 13a; a first contact part 13b that extends upwardly from the spring part 13a; and a second contact part 13c that extends downwardly from the spring part 13a.

The spring part 13a includes: a middle portion 13d that is inserted into an insertion hole 15a in the intermediate plate 15; a first spring region 13e that extends to be inclined upwardly from the middle portion 13d (i.e., in a direction approaching the upper side plate 14); and a second spring region 13f that extends to be inclined downwardly from the middle portion 13d (i.e., in a direction approaching the lower side plate 16). As a result, the spring part 13a is formed in a substantially "V"-shape (or may be formed in a substantially "U"-shape). Forming the spring part 13a in a V-shape or a U-shape enables variation of the biasing force caused by the deformation of the spring part 13a (vertical movement of the first contact part 13b) to be extremely reduced.

Figure 4A:
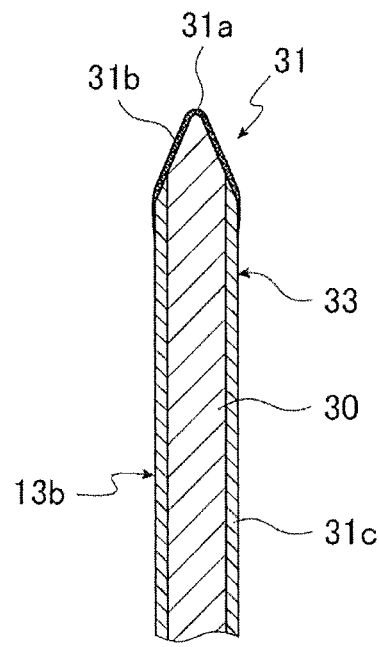
FIGS. 4A and 4B are cross-sectional views each schematically illustrating a wire probe according to Embodiment 1 of the present invention, where

The first contact part 13b is inserted into an insertion hole 14a in the upper side plate 14. The first contact part 13b is provided with a substantially conical-shaped distal end portion 31 to the distal end of the first contact part 13b as illustrated in an enlarged view of FIG. 4A. Furthermore, the distal end portion 31 has a spherical surface 31a formed thereon, the spherical surface 31a having a radius of 2 μm or more and 10 μm or less (preferably 2 μm or more and 5 μm or less).

A contact area between the first contact part 13b and the solder ball 11a of the IC package 11 can be made sufficiently small by setting the radius of the spherical surface 31a to 10 μm or less, so that the tin which is a material for forming the solder ball 11a can hardly remain on the distal end portion 31 of the first contact part 13b. A wear-resistant contact point film 31b (to be described later) can be formed on the spherical surface 31a in a state of being sufficiently hardly peeled off from the spherical surface 31a by setting the radius of the spherical surface 31a to 2 μm or more. Then, even if the wire probe 13 is repeatedly used for a long period of time, the contact area with the solder ball 11a can be prevented from being increased due to wear of the distal end portion 31.

Figure 4B:
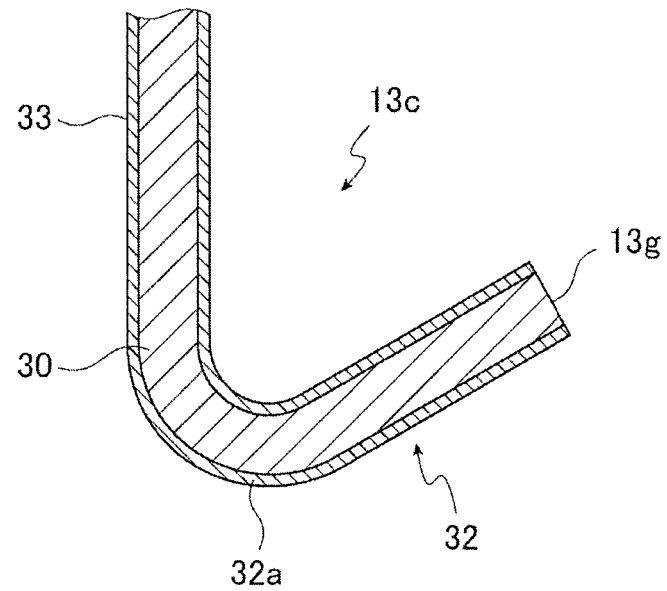

The second contact part 13c is inserted into an insertion hole 16a in the lower side plate 16 and an insertion hole 17a in the elastomer sheet 17 as illustrated in FIGS. 2A and 2B. The second contact part 13c has a distal end portion that is bent upwardly by 90 degrees or more to form an L-shaped contact point 32 as illustrated in an enlarged view of FIG. 4B.

The wire probe 13 is made of a springy base material 30 such as stainless steel, piano wire (carbon steel), or tungsten, for example. The base material 30 that can be used has 4 to 12 mm in length and 0.05 to 0.2 mm in diameter.

The conductive wear-resistant contact point film 31b (for example, 0.1 to 3.0 μm in thickness) is formed on the distal end portion 31 of the first contact part 13b of each wire probe 13 by, for example, a film formation method such as CVD (Chemical Vapor Deposition) method, or PVD (Physical Vapor Deposition) method. The wear-resistant contact point film 31b may be formed in a region including at least the spherical surface 31a. By thus forming the wear-resistant contact point film 31b on the spherical surface 31a of the distal end portion 31, the spherical surface 31a can be hardly worn out, thereby preventing the contact area between the first contact part 13b and the solder ball 11a of the IC package 11 from being increased. Examples of the wear-resistant contact point film 31b that can be used include a carbon film, or a ruthenium film, an iridium film, a gold film, a silver film, a palladium film, a rhodium film, or an alloy film of these metals. As compared with the base material 30 of the wire probe 13, the wear-resistant contact point film 31b has a sufficient wear resistance, and if the wear-resistant contact point film 31b is chemically inactive (hardly alloyed) to the solder ball 11a (e.g., tin) of the IC package 11, a film of another material can be used as the wear-resistant contact point film 31b.

On the other hand, a highly conductive film 33 (for example, 5 to 10 μm in thickness) for reducing the electric resistance is formed by, for example, a plating process on at least a surface region 31c between a region for forming the wear-resistant contact point film 31b and a bent portion (distal end portion) 32a of the L-shaped contact point 32 in a surface of each wire probes 13. The highly conductive film 33 can be formed by using, for example, silver, nickel, copper, or the like. If the highly conductive film 33 has an electric resistance lower than that of the base material 30 of the wire probe 13, a film of another material can be used as the highly conductive film 33. The highly conductive film 33 may have the wear resistance inferior to that of the above-described wear-resistant contact point film 31b, but the highly conductive film 33 having excellent electric conductivity is desirably used. Note that the wear-resistant contact point film 31b and the highly conductive film 33 may be formed of the same material.

Figure 1B:
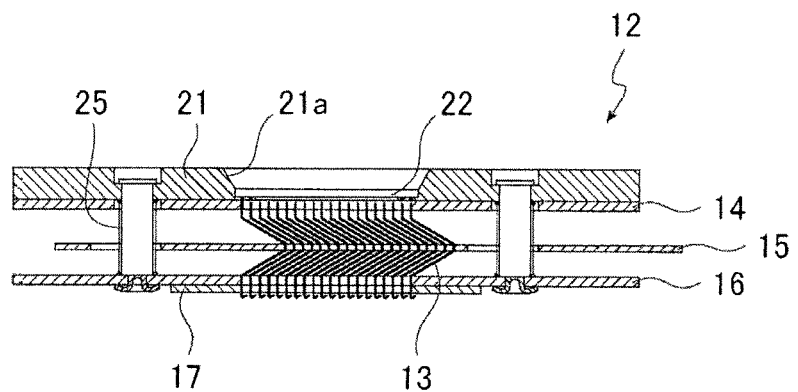

The upper side plate 14 is provided with a housing member 21 for housing the IC package 11 therein on an upper surface side of the upper side plate 14, and a region 22 for disposing the above-described probe is provided in a substantially center portion of the housing member 21, as illustrated FIGS. 1A, 1B, and 3A. Note that a guide part 21a for guiding the IC package 11 onto the probe disposing region 22 is provided on the housing member 21. The above-described insertion holes 14a (see FIG. 2A) are formed in the probe disposing region 22. A conical-shaped ball guide 14b is provided on the upper surface of the upper side plate 14 (see FIGS. 1A, 1B, and 2A). The ball guide 14b houses the solder ball 11a therein to position the IC package 11. The ball guides 14b may be provided corresponding to all of the solder balls 11a, may be provided corresponding to only some of the solder balls 11a, or need not be provided.

The upper side plate 14 is provided in the IC socket 12, and is vertically movably supported by support means (not illustrated) in an upwardly biased state. When being pressed downwardly, the upper side plate 14 is guided by guide pins 25 and moved downwardly against the biasing force. When the upper side plate 14 is moved to the highest position, the solder balls 11a of the IC package 11 are separated from the distal end portion 31 of the first contact part 13b provided in the wire probe 13, as illustrated in FIG. 2A. On the other hand, when the IC package 11 is pressed downwardly and the upper side plate 14 is moved downwardly, the solder balls 11a of the IC package 11 each are brought into pressure-contact with the corresponding distal end portion 31 of the first contact part 13b, as illustrated in FIG. 2B. It is then desirable for the contact pressure between the solder ball 11a and the distal end portion 31 to be 5 grams or less. When the contact pressure is set to 5 grams or less, the wear-resistant contact point film 31b formed on the spherical surface 31a of the wire probe 13 can be hardly peeled off and worn out, thereby capable of preventing the contact area between the spherical surface 31a and the solder ball 11a from being increased. Note that as the radius of the spherical surface 31a is 5 µm or less, the contact resistance between the first contact part 13b of the wire probe 13 and the solder ball 11a of the IC package 11 becomes sufficiently low even if the contact pressure is set to 5 grams or less. As described above, forming the spring part 13a in a V-shape or a U-shape enables variation of the biasing force caused by a deformation amount of the spring part 13a (vertical movement amount of the first contact part 13b) to be extremely reduced. Therefore, the contact pressure between the solder ball 11a and the distal end portion 31 can be easily set.

The intermediate plate 15 is provided with a probe disposing region 23 that corresponds to the probe disposing region 22 of the upper side plate 14, as illustrated in FIG. 3B. The above-described insertion holes 15a (see FIG. 2A) are formed in the probe disposing region 23.

The intermediate plate 15 is formed of an insulating material, and is engaged with the bent portion provided in the spring part 13a of each wire probe 13 (here a boundary portion between the middle portion 13d and the second spring region 13f of the wire probe 13).

Providing the intermediate plate 15 can prevent short circuit caused by a contact between wire probes 13.

As the intermediate plate 15 is only engaged with the wire probes 13, the intermediate plate 15 is moved in parallel in a right downward direction illustrated in FIGS. 2A and 2B when the upper side plate 14 is moved downwardly against the biasing force and the solder balls 11a of the IC package 11 each are brought into pressure-contact with the corresponding distal end portion 31 of the wire probes 13 (i.e., when the state of FIG. 2A is changed to the state of FIG. 2B). On the contrary, when the upper side plate 14 is moved upwardly, and the solder balls 11a of the IC package 11 are separated from the distal end portions 31 of the wire probes 13 (i.e., when the state of FIG. 2B is changed to the state of FIG. 2A), the intermediate plate 15 is moved in a left upward direction illustrated in FIGS. 2A and 2B. The intermediate plate 15 is thus freely moved in an oblique direction, thereby smoothly enabling the contact and separation between the solder ball 11a and the distal end portion 31 of the wire probe 13 (i.e., upward and downward movements of the upper side plate 14).

Note that the intermediate plate 15 need not to be necessarily positioned at a center between the upper side plate 14 and the lower side plate 16, and may be displaced upwardly or downwardly from the center.

In Embodiment 1, the number of the intermediate plate 15 is one, but may be plural. If a plurality of intermediate plates 15 are used, it is desirable for the wire probe 13 to be formed in a substantially "U" shape.

The lower side plate 16 is provided in the IC socket 12, and is fixed by fixing means (not illustrated). The elastomer sheet 17 is provided on a bottom surface of the lower side plate 16.

The lower side plate 16 is provided with a probe disposing region 24 that corresponds to the probe disposing region 22 of the upper side plate 14, as illustrated in FIG. 3C. The insertion holes 16a (see FIG. 2A) are formed in the probe disposing region 24. The elastomer sheet 17 is provided with insertion holes 17a that correspond to the insertion holes 16a in the lower side plate 16, respectively. As illustrated in, FIGS. 2A and 2B, the second contact part 13c of the wire probe 13 is inserted into the insertion hole 16a in the lower side plate 16 and the insertion hole 17a in the elastomer sheet 17. The elastomer sheet 17 is elastically deformed when the elastomer sheet 17 is pressed to the lower side plate 16, and the bent portion 32a of the L-shaped contact point 32 is pressed to the wiring board 10 by an elastic reaction force, thus making the second contact part 13c and the electrode 10a conductive.

Note that Embodiment 1 provides a configuration in which the pressing force of the elastomer sheet 17 is received by the L-shaped contact point 32, but the stress caused when the elastomer sheet 17 is elastically deformed may be applied to the second contact part 13c using the other configuration.

However, the L-shaped contact point 32 can be used only by bending the second contact part 13c. Furthermore, using the L-shaped contact point 32 does not require bringing a cutting section 13g of the second contact part 13c into contact with the electrode 10a (see FIG. 4B), and subjecting the cutting section 13g to surface treatment, thereby capable of reducing the manufacturing cost of the wire probe 13.

In Embodiment 1, the contact pressure between the second contact part 13c and the electrode 10a is applied, not by the biasing force of the spring part 13a of the wire probe 13, but by a pressing force of the lower side plate 16. According to Embodiment 1, the contact pressure of each wire probe 13 can be made uniform. Furthermore, the contact pressure can be set to different values between on the first contact part 13b side and on the second contact part 13c side. Accordingly, even if the contact pressure to each of the solder balls 11a of the IC package 11 is made sufficiently small, the reliability of the electrical connection between the wire probe 13 and the electrode 10a of the wiring board 10 is not impaired.

A manufacturing method of the IC socket 12 according to Embodiment 1 is described below.

A method of manufacturing a wire for the wire probe 13 is described with reference to FIGS. 5A, 5B, 5C, 5D, and 5E.

Figure 5A:
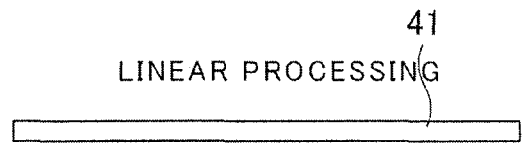
FIGS. 5A, 5B, 5C, 5D, and 5E are cross-sectional views each schematically illustrating a manufacturing process for the IC socket according to Embodiment 1 of the present invention.

The highly conductive film (for example, silver, nickel, copper, or the like) 33 is formed on the base material 30 of the wire (see FIGS. 4A and 4B) by, for example, plating process. The wire is cut by, for example, 50 mm. Thus, a wire material 41 as a "springy wire material" as illustrated in FIG. 5A is manufactured.

Figure 5B:
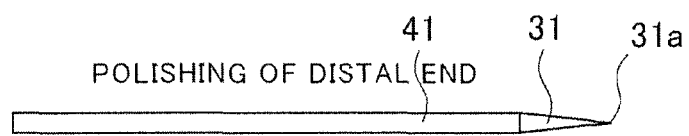

One end of the wire material 41 is polished to form the substantially conical-shaped distal end portion 31 as illustrated in FIG. 5B. The spherical surface 31a is formed at a tip of the distal end portion 31, the spherical surface 31a having a radius of 2 µm or more and 10 µm or less (preferably, 2 µm or more and 5 µm or less).

Figure 5C:
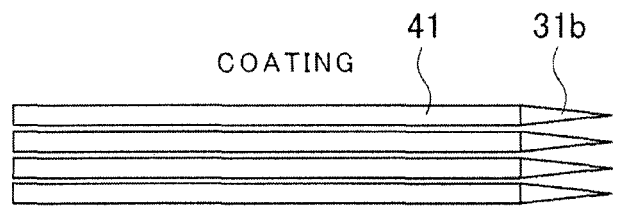

The distal end portion 31 of the wire material 41 is coated with carbon film (or ruthenium, an iridium film, a gold film, a silver film, a palladium film, a rhodium film, or an alloy film of these metals) by, for example, a PVD (Physical Vapor Deposition) method or a CVD (Chemical Vapor Deposition) method. Then, the wear-resistant contact point film 31b as illustrated in FIG. 5C is formed.

The wire material 41 is cut to a length used as the wire probe 13 (for example, 6 to 10 mm). Thus, the probe wire 42 as illustrated in FIG. 5D can be obtained.

Figure 5D:
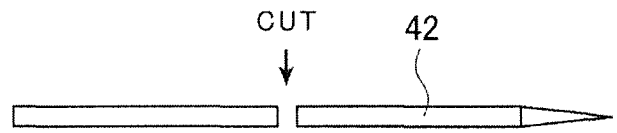
Figure 5E:
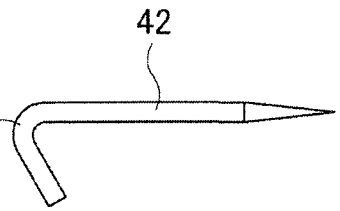

In Embodiment 1, one end of the longer wire material 41 (here a length of about 50 mm) is subjected to a polishing process to easily polish the wire material 41 (see FIG. 5B), the wear-resistant contact point film 31b is formed (see FIG. 5C), and then the wire material 41 is cut (see FIG. 5D). However, the wire material 41 may be cut to a length of the wire probe 13 in the first cutting process (see FIG. 5A) without performing the cutting process of FIG. 5D. Alternatively, the cutting process (see FIG. 5D) may be performed following the polishing process (see FIG. 5B), and then the wear-resistant contact point film 31b may be formed (see FIG. 5C).

Then, the other end of the probe wire 42 that is not subjected to the polishing process is bent to form the L-shaped contact point 32. As described above, in Embodiment 1, the polishing may be performed only on the end of the wire material 41 (probe wire 42) on the first contact part 13b side, and the L-shaped contact point 32 is formed on the end on the second contact part 13c side, thereby enabling the polishing process to be simplified.

Thus, the probe wire 42 is completed.

A method of assembling the IC socket 12 is described with reference to FIGS. 6A, 6B, 6C, 7A, and 7B.

The upper side plate 14, the intermediate plate 15, the lower side plate 16, and the elastomer sheet 17 as described above are prepared. The elastomer sheet 17 is disposed on the lower side plate 16 by adhesion or the like. The upper side plate 14, the intermediate plate 15, the lower side plate 16, and the elastomer sheet 17 are laminated in order from below (i.e., in a reverse order to the laminating order when being used as illustrated in FIGS. 2A and 2B). At this time, the insertion holes 14a, 15a, 16a, 17a are so positioned as to be aligned.

A mask plate 51 is disposed on the elastomer sheet 17. The mask plate 51 includes a plurality of grooves 52 corresponding to the insertion holes 14a, 15a, 16a, 17a, as illustrated FIGS. 6A and 7A. Each of these grooves 52 is formed at a position and in a size capable of housing the L-shaped contact point 32 of the probe wire 42 therein.

Figure 6A:
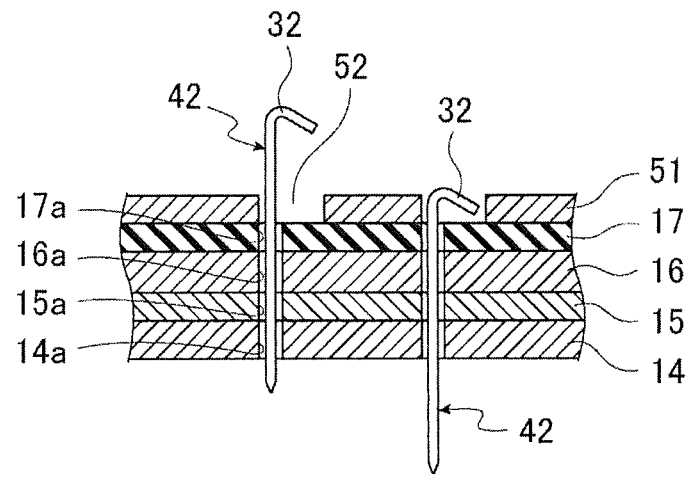
FIGS. 6A, 6B and 6C are cross-sectional views each schematically illustrating a manufacturing process for the IC socket according to Embodiment 1 of the present invention.
Figure 7A:
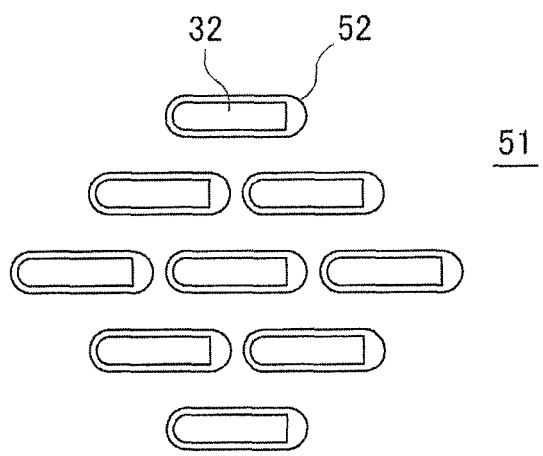
FIGS. 7a and 7B are diagrams each schematically illustrating a manufacturing process of the IC socket according to Embodiment 1 of the present invention, where

As illustrated in FIGS. 6A and 7A, the probe wire 42 as a "springy wire material" is inserted into the groove 52, and the insertion holes 14a, 15a, 16a, 17a from above the mask plate 51 while directing the L-shaped contact point 32 upward. At this time, the L-shaped contact point 32 is housed in the groove 52 in the mask plate 51. The L-shaped contact points 32 of the probe wires 42 are housed in the grooves 52, respectively while aligning the directions of the L-shaped contact points 32, thereby capable of preventing these L-shaped contact points 32 from being in contact with one another.

Figure 6B:
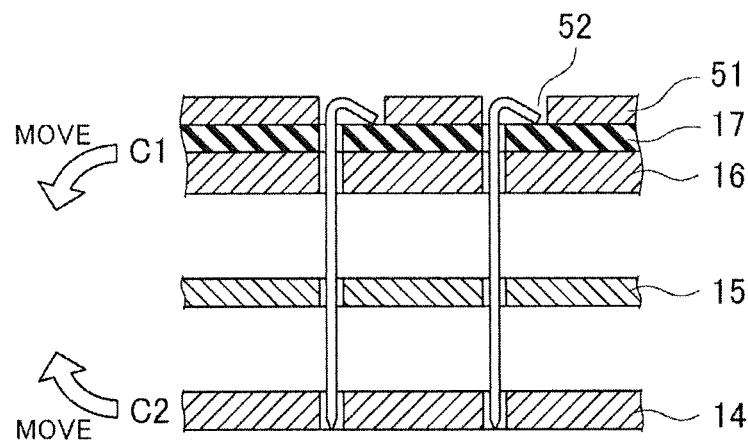
Figure 6C:
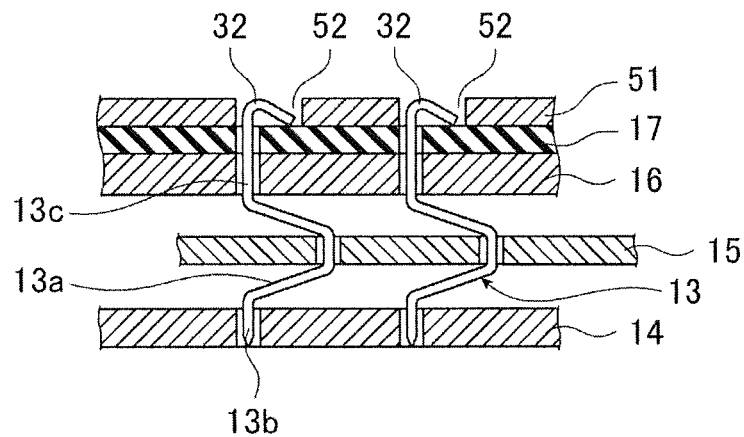
Figure 7B:
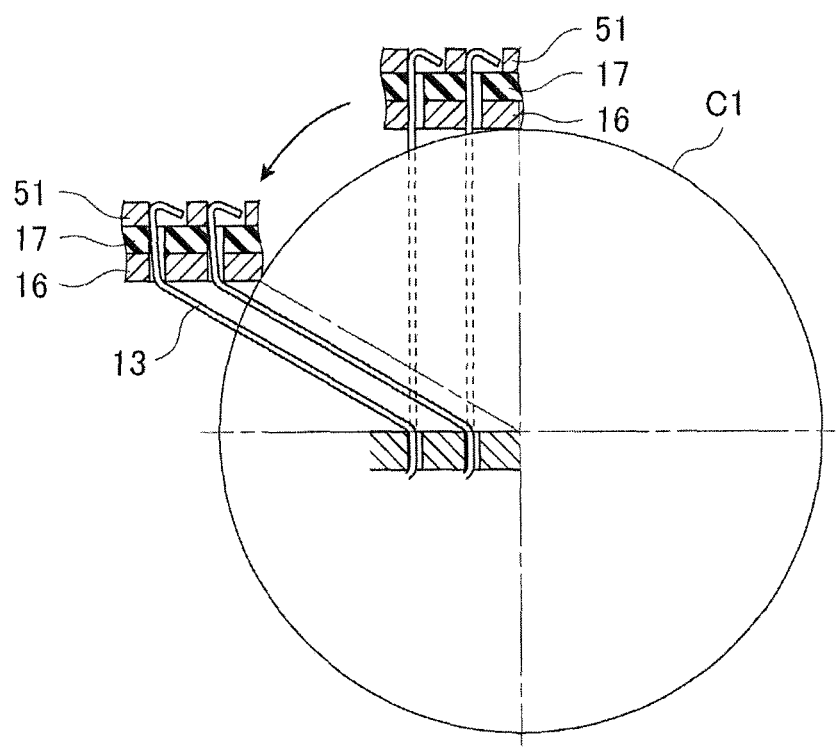

As illustrated in FIG. 6B, the upper side plate 14, the intermediate plate 15 and the lower side plate 16 are separated from one another. At this time, the intermediate plate 15 need not to be necessarily positioned at a center between the upper side plate 14 and the lower side plate 16, and may be displaced upwardly or downwardly from the center. As illustrated in FIGS. 6B and 7B, the lower side plate 16 is moved in parallel along a first circumferential direction C1 in a state where the intermediate plate 15 is fixed by the fixing means (not illustrated). Similarly, the upper side plate 14 is also moved along a second circumferential direction C2 in the state where the intermediate plate 15 is fixed by the fixing means (see FIG. 6B). Then, as illustrated in FIG. 6C, the probe wire 42 is plastically deformed to be capable of simultaneously form the substantially "V"-shaped spring part 13a, the first contact part 13b that extends upwardly from the spring part 13a and the second contact part 13c that extends downwardly from the spring part 13a.

Note that in Embodiment 1, the lower side plate 16 and the upper side plate 14 are simultaneously moved in the circumferential directions, but may be separately moved in the circumferential directions.

Then, the mask plate 51 is removed from the elastomer sheet 17. The upper side plate 14 is vertically movably attached in the IC socket 12 using the support means (not illustrated), and the lower side plate 16 is fixed and attached, to complete the IC socket 12.

A method of using the IC socket 12 of such a configuration is described below.

The IC socket 12 is previously fixed on the wiring board 10 so that the lower side plate 16 of the IC socket 12 presses the elastomer sheet 17. As a result, the elastomer sheet 17 is elastically deformed. The bent portion 32a of the L-shaped contact point 32 is pressed to the wiring board 10 by a reaction force of the elastic deformation, thus making the second contact part 13c and the electrode 10a conductive.

The IC package 11 is carried by an automatic machine, guided by the guide part 21a of the housing member 21 (see FIG. 1B), and housed on the probe disposing region 22 of the upper side plate 14 (see FIG. 2A).

When the IC package 11 is pressed downwardly by pressing means (not illustrated), the upper side plate 14 is guided by guide pins 25 (see FIG. 1B) and moved downwardly against the biasing force of the support means (not illustrated). Then, the solder balls 11a of the IC package 11 each are brought into pressure-contact with the corresponding distal end portion 31 of the wire probe 13 at a predetermined contact pressure (see FIG. 2B). As a result, the solder ball 11a and the first contact part 13b of the wire probe 13 are made conductive. Note that when the upper side plate 14 is moved downwardly, the intermediate plate 15 is moved in parallel in the right downward direction illustrated in FIGS. 2A and 2B.

After the IC package 11 is thus electrically connected to the wiring board 10 through the wire probe 13, a burn-in test or the like is performed.

As described above, according to Embodiment 1, the wire probe 13 can be formed in which the contact pressure against the solder ball 11a of the IC package 11 is very small. Thus, the tin that is a material for forming the solder ball 11a is hardly attached to the first contact part 13b of the wire probe 13, and therefore the contact resistance can be sufficiently reduced when the wire probe 13 is in contact with the IC package 11, and can be hardly increased even if the electric contact is used for a long period of time.

According to Embodiment 1, the spring part 13a can be formed only by plastically deforming the center portion of the springy wire material into a substantially "V" shape or a substantially "U" shape, thereby capable of manufacturing the IC socket 12 in a simple process and at a low cost.

Furthermore, according to Embodiment 1, the upper side plate 14 is vertically movably supported, and the second plate is fixed, thereby capable of sufficiently increasing the contact pressure of the second plate against the electrodes 10a of the wiring board 10 even if the contact pressure of upper side plate 14 against the solder balls 11a of the IC package 11 is very small.

According to Embodiment 1, the intermediate plate 15 is engaged with a boundary portion between the first spring region 13e and the second spring region 13f of the wire probe 13, thereby capable of smoothly deforming the wire probe 13 when the IC package 11 is housed in the upper side plate 14.

In Embodiment 1, the substantially linear wire material 41 is inserted into the insertion holes 14a, 15a, 16a, 17a corresponding to the plates 14, 15, 16 and the elastomer sheet 17, respectively, and then the upper side plate 14 and the lower side plate 16 are moved with respect to the intermediate plate 15, so that the wire material 41 is plastically deformed to manufacture the wire probe 13. Accordingly, the wire probe 13 can be manufactured only by a very simple process.

In Embodiment 1, the intermediate plate 15 used to plastically deform the wire probe 13 is used as it is as the plate for preventing a contact between the wire probes, thereby further simplifying the manufacturing process.

In addition, in Embodiment 1, the plastic deformation of the upper portion of the wire probe 13 and the plastic deformation of the lower portion of the wire probe 13 are performed simultaneously, thereby capable of further reducing the number of manufacturing processes.

As a result, in Embodiment 1, the IC socket 12 can be manufactured at a low cost.

Embodiment 1 has been described as an example where the present invention is applied to the IC socket 12 for the IC package 11, but the present invention can be also applied to the other type of electric component socket.

REFERENCE SIGNS LIST 10 wiring board
10a electrode
11 IC package
11a solder ball
12 IC socket
13 wire probe
13a spring part
13b first contact part
13c second contact part
13e first spring region
13f second spring region
14 upper side plate
14a, 15a, 16a, 17a insertion hole
14b ball guide
15 intermediate plate
16 lower side plate
17 elastomer sheet
21 housing member
22, 23, 24 probe disposing region
30 base material
31 distal end portion
31a spherical surface
31b wear-resistant contact point film
31c surface region
32 L-shaped contact point
32a bent portion
33 highly conductive film
41 wire material
42 probe wire
42 wire
51 mask plate
52 groove

The invention claimed is:

1. A method of manufacturing an electric component socket, the electric component socket including an electric contact that includes: a first contact part that is inserted into a first insertion hole in a first plate to be in contact with a first electrode of a first electric component; a second contact part that is inserted into a second insertion hole in a second plate to be in contact with a second electrode of a second electric component; and a spring part that brings at least the first contact part into contact with the first electrode of the first electric component by a predetermined contact pressure, the method comprising:
   a first step of inserting a substantially linear springy wire material into the first insertion hole in the first plate and the second insertion hole in the second plate in a state where the first plate and the second plate are set close to each other;
   a second step of separating the first plate and the second plate from one another so that the first contact part of the springy wire material is inserted into the first insertion hole and the second contact part is inserted into the second insertion hole;
   a third step of moving the first plate with respect to wire support means in a state where a substantially center portion of the springy wire material is supported by the wire support means so that a region of the springy wire material between the first plate and the wire support means is plastically deformed; and
   a fourth step of moving the second plate with respect to the wire support means in a state where the substantially center portion of the springy wire material is supported by the wire support means so that a region of the springy wire between the second plate and the wire support means is plastically deformed.

2. The method of manufacturing an electric component socket according to claim 1, wherein the third and fourth steps each are a step of moving the first and second plates in a circular arc shape in a stationary state of the wire support means.

3. The method of manufacturing an electric component socket according to claim 1, wherein
   the electric component socket is further provided with a third insulating plate that is disposed between the first plate and the second plate to prevent a contact between the electric contacts, the third plate has a third insertion hole to insert the springy wire material therethrough, and the second step and the third step use the third plate as the wire support means.

4. The method of manufacturing an electric component socket according to claim 1, wherein the third step and the fourth step are performed simultaneously.

5. An electric component socket, wherein the electric component socket is manufactured by the method of manufacturing an electric component socket according to claim 1.

* * * * *